(12) United States Patent
Vashchenko et al.

(10) Patent No.: US 7,217,966 B1
(45) Date of Patent: May 15, 2007

(54) SELF-PROTECTING TRANSISTOR ARRAY

(75) Inventors: Vladislav Vashchenko, Palo Alto, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 251 days.

(21) Appl. No.: 11/060,877

(22) Filed: Feb. 18, 2005

(51) Int. Cl.
*H01L 27/10* (2006.01)
*H01L 29/739* (2006.01)
*H01L 29/73* (2006.01)
*H01L 29/74* (2006.01)

(52) U.S. Cl. ............... 257/210; 257/202; 257/203; 257/204; 257/205; 257/206; 257/207; 257/208; 257/209; 257/211

(58) Field of Classification Search ......... 257/202–211
See application file for complete search history.

(56) References Cited

U.S. PATENT DOCUMENTS

| | | | | |
|---|---|---|---|---|
| 5,060,037 A | | 10/1991 | Rountree | 257/357 |
| 5,726,458 A | * | 3/1998 | Bui | 257/48 |
| 5,789,791 A | * | 8/1998 | Bergemont | 257/401 |
| 5,793,068 A | * | 8/1998 | Mahant-Shetti | 257/204 |
| 5,903,019 A | * | 5/1999 | Watanabe | 257/208 |
| 6,081,004 A | * | 6/2000 | Wong et al. | 257/205 |
| 6,140,686 A | * | 10/2000 | Mizuno et al. | 257/369 |
| 6,335,640 B1 | * | 1/2002 | Okamoto | 326/101 |
| 6,525,350 B1 | * | 2/2003 | Kinoshita et al. | 257/202 |
| 6,833,595 B1 | * | 12/2004 | Iwasaki | 257/401 |
| 6,987,293 B2 | * | 1/2006 | Sakamoto et al. | 257/202 |
| 6,995,436 B2 | * | 2/2006 | Kawasaki | 257/390 |
| 7,005,350 B2 | * | 2/2006 | Walker et al. | 438/268 |

\* cited by examiner

*Primary Examiner*—Ida M. Soward
(74) *Attorney, Agent, or Firm*—Mark C. Pickering (57) ABSTRACT

A transistor array is self-protected from an electrostatic discharge (ESD) event which can cause localized ESD damage by integrating an ESD protection device into the transistor array. The ESD protection device operates as a transistor during normal operating conditions, and provides a low-resistance current path during an ESD event.

16 Claims, 6 Drawing Sheets

SELF-PROTECTING TRANSISTOR ARRAY

BACKGROUND OF THE INVENTION

1. Field of the Invention

The present invention relates to a transistor array and, more particularly, to a self-protecting transistor array.

2. Description of the Related Art

An open drain output circuit is an output circuit that pulls the voltage on an output pad to ground when turned on, and isolates the output pad from ground when turned off. The open drain output circuit typically utilizes an NMOS transistor to control the voltage on the output pad during normal operation, and an electrostatic discharge (ESD) clamp, such as a grounded-gate NMOS transistor, to control the voltage on the output pad during an ESD event.

Figures 1, 2A:
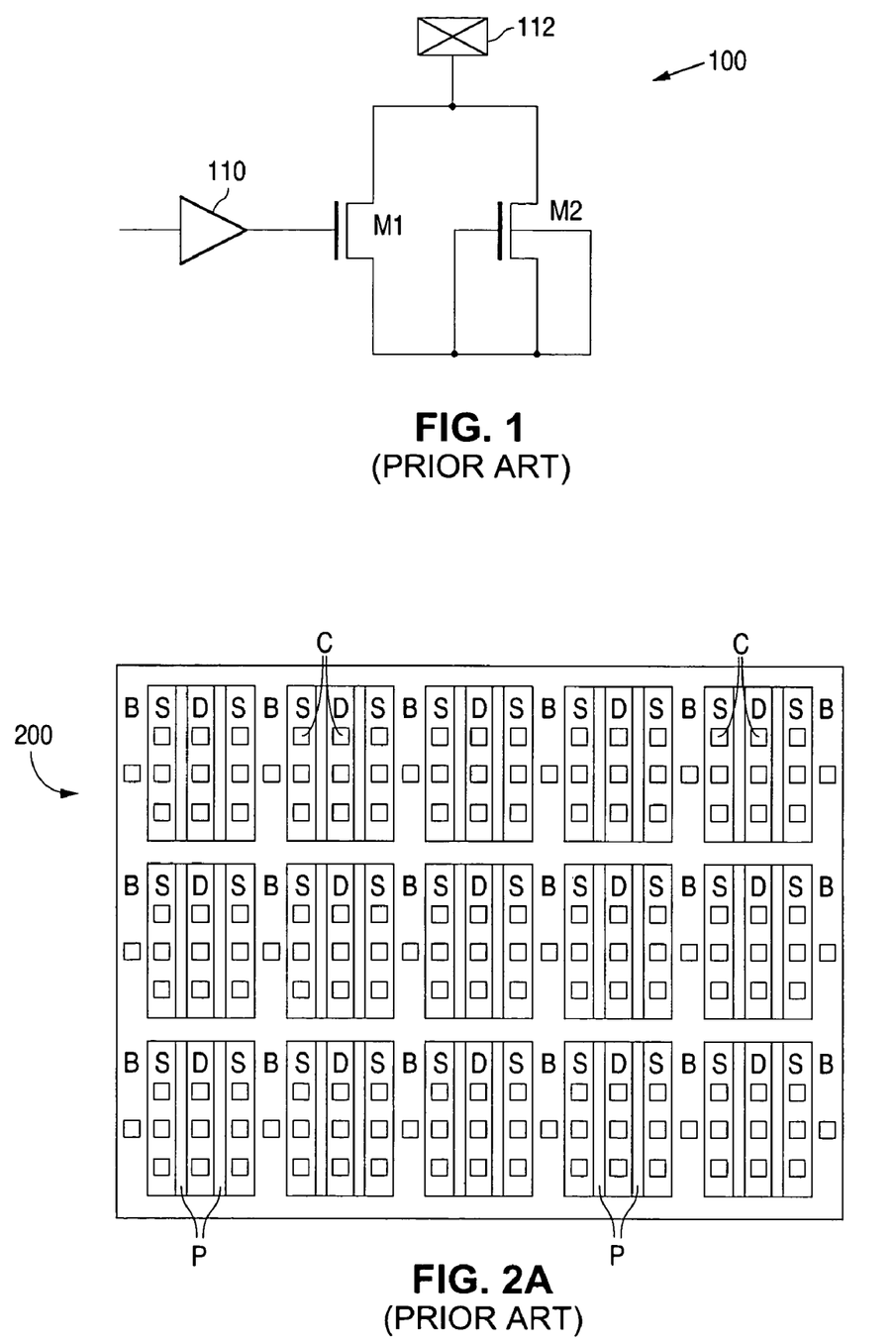
FIG. 1 is a circuit diagram illustrating a prior-art open drain output circuit 100.
FIGS. 2A and 2B are plan views illustrating examples of two prior-art NMOS transistor arrays 200 and 202, respectively.

FIG. 1 shows a circuit diagram that illustrates a prior-art open drain output circuit 100. As shown in FIG. 1, circuit 100 includes an output driver 110, an NMOS transistor M1, and a grounded-gate NMOS transistor M2. NMOS transistor M1 has a drain connected to an output pad 112, a gate connected to the output of driver 110, and a source connected to ground. NMOS transistor M2 has a drain connected to output pad 112. In addition, NMOS transistor M2 has a gate, a body, and a source connected to ground.

During normal operation, output driver 110 of circuit 100 controls the on and off state of NMOS transistor M1. When turned on, NMOS transistor M1 pulls the voltage on output pad 112 down to ground. When turned off, NMOS transistor M1 electrically isolates output pad 112 from ground.

During an ESD event, transistor M2 functions as an ESD clamp by limiting the maximum voltage on output pad 112. When the voltage on output pad 112 rises sharply with respect to ground, the junction of the n+ drain and the p– body of transistor M2 becomes reverse biased, and then breaks down. When the junction breaks down, a hole current flows from the junction through the p– body to the p+ body contact, past the n+ source region.

The hole flow locally increases the potential which, in turn, forward biases the body-to-source junction, thereby turning on a parasitic npn bipolar transistor and substantially increasing the current flow. The n+ drain of transistor M2 forms the n+ collector of the parasitic npn bipolar transistor, while the p– body forms the p– base and the n+ source forms the n+ emitter. Thus, transistor M2 turns on at a triggering point, and then snaps back to provide a low resistance current path when the body-to-source junction becomes forward biased.

Figure 2B:
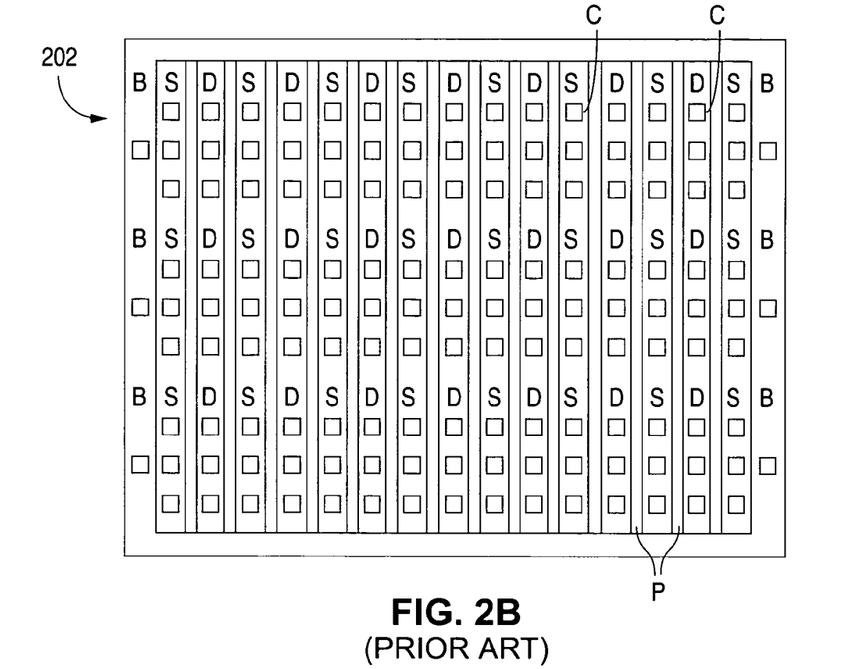

It is common practice to form NMOS transistor M1 as a transistor array. FIGS. 2A and 2B show plan views that illustrates examples of two prior-art, NMOS transistor arrays 200 and 202, respectively. As shown in FIG. 2, arrays 200 and 202 both include a number of spaced-apart n+ source strips S, and a number of spaced-apart n+ drain strips D such that one drain strip D lies between each adjacent pair of source strips S.

Further, arrays 200 and 202 include a number of polysilicon gate strips P such that a gate strip P lies over and between each adjacent source strip S and drain strip D. Arrays 200 and 202 additionally include a p+ body contact region B, and a number of contacts C that are connected to the source strips S, the drain strips D, and the body contact region B.

In the present example, all of the contacts C connected to all of the drain strips D are electrically connected to output pad 112. Arrays 200 and 202 differ only in the arrangement of the p+ body contact region B, and illustrate that the p+ body contact regions B can have a number of different shapes.

One problem with using a transistor array, such as array 200, is that it is difficult to protect the transistor array from ESD damage. Although grounded-gate NMOS transistor M2 provides ESD protection, a number of different factors, such as current crowding and the different gate potentials of transistors M1 and M2, can cause localized areas of transistor array 200 to be permanently damaged by an ESD event before transistor M2 can turn on and protect transistor array 200. Thus, there is a need for an ESD clamp which can provide ESD protection for an open drain output circuit.

BRIEF DESCRIPTION OF THE DRAWINGS

FIGS. 4A–4B are views illustrating an example of a first embodiment 400 of self-protecting NMOS transistor array 300 in accordance with the present invention. FIG. 4A is a plan view, while

FIGS. 5A–5B are views illustrating an example of a second embodiment 500 of self-protecting NMOS transistor array 300 in accordance with the present invention. FIG. 5A is a plan view, while

FIGS. 6A–6B are views illustrating an example of a third embodiment 600 of self-protecting NMOS transistor array 300 in accordance with the present invention. FIG. 6A is a plan view, while

DETAILED DESCRIPTION OF THE INVENTION

Figure 3:
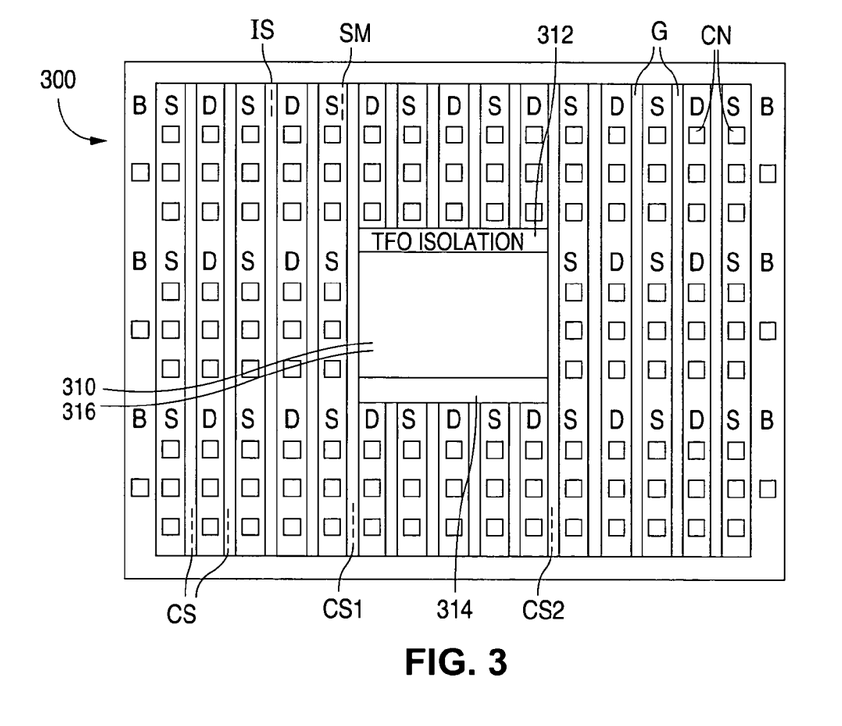
FIG. 3 is a plan view illustrating an example of a self-protecting NMOS transistor array 300 in accordance with the present invention.

FIG. 3 shows a plan view that illustrates an example of a self-protecting NMOS transistor array 300 in accordance with the present invention. As described in greater detail below, transistor array 300 includes built-in protection that protects localized areas of the transistor array from an ESD event.

As shown in FIG. 3, transistor array 300, which is formed in a p– semiconductor material SM, includes a number of spaced-apart n+ source strips S that contact p– semiconductor material SM. In addition, array 300 also includes a number of spaced-apart n+ drain strips D that contact p– semiconductor material SM.

Further, array 300 includes a number of channel strips CS of semiconductor material SM. The channel strips CS lie between the source and drain strips S and D so that each channel strip CS lies between and contacts a source strip S and a drain strip D. Array 300 additionally includes a number of isolation strips IS that contact the channel strips CS.

Array 300 also includes a number of gate strips G that contact the isolation strips IS, a p+ body contact region B that contacts semiconductor material SM, and a number of contacts CN that are connected to the source strips S, the drain strips D, and the body contact region B. In the present example, all of the contacts CN connected to all of the drain strips D are electrically connected to an output pad.

In accordance with the present invention, transistor array 300 also includes a localized region 310 that contacts a first channel strip CS1 and a second channel strip CS2. As shown in FIG. 3, localized region 310 includes a first isolation region 312 and a second isolation region 314. First isolation region 312 contacts semiconductor material SM and extends from first channel strip CS1 to second channel strip CS2. Second isolation region 314 also contacts semiconductor material SM and extends from first channel strip CS1 to second channel strip CS2.

As further shown in FIG. 3, localized region 310 includes an ESD region 316 that contacts semiconductor material SM, a portion of first channel strip CS1, and a portion of second channel strip CS2. ESD region 316 lies between and contacts the first and second isolation regions 312 and 314.

In addition, as a result of localized region 310, the source strips S, drain strips D, and channel strips CS that lie above and below localized region 310 have different lengths than the source strips S, drain strips D, and channel strips CS that lie to the side of localized region 310. Further, a number of channel strips CS are located between the first and second channel strips CS1 and CS2. In the FIG. 3 example, four channels strips CS are located between the first and second channel strips CS1 and CS2.

Localized region 310 is shown placed in the center of transistor array 300 in the FIG. 3 example. Localized region 310, however, can be placed anywhere on array 300 which is subject to localized ESD damage. In addition, any number of localized regions can be included within transistor array 300.

During normal operation, localized region 310 functions as an NMOS transistor. In other words, when a gate voltage is applied to the gate strips G, a current flows from localized region 310 to the source strips S that adjoin the first and second channel strips CS1 and CS2. In addition, when the gate voltage is removed, the current stops.

However, during an ESD event, localized region 310 functions as an ESD protection device. In other words, when an ESD pulse is applied to the drain strips D, an ESD current safely flows from localized region 310 to the source strips S that adjoin the first and second channel strips CS1 and CS2.

As a result, when an ESD pulse is applied, localized region 310 prevents the voltage on the drain strips D from exceeding a predetermined value. Thus, by utilizing localized region 310, any region of transistor array 300 can be protected from localized ESD damage while at the same time maintaining transistor functionality.

Figure 4A:
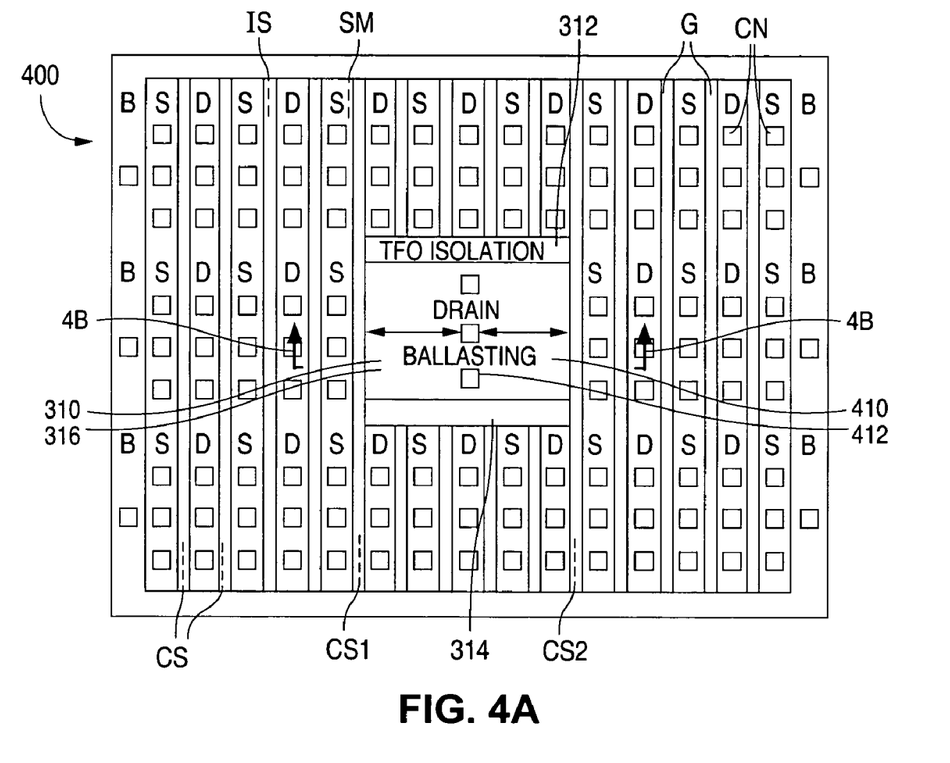
Figure 4B:
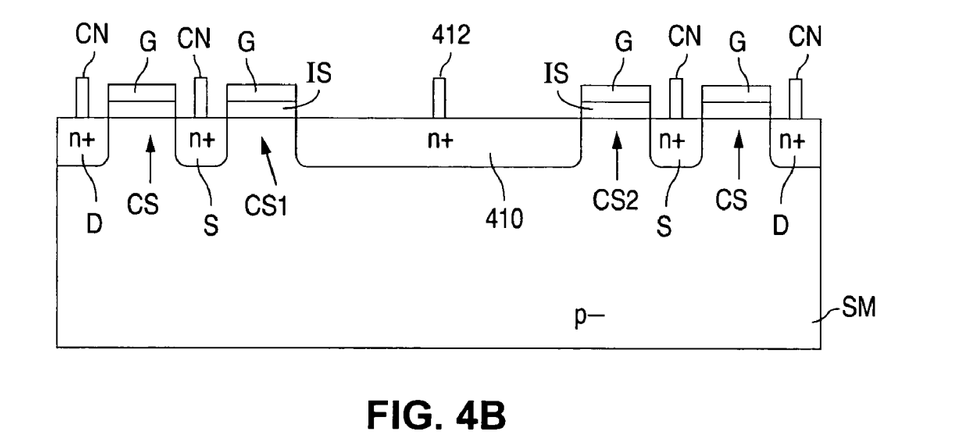
FIG. 4B is a cross-sectional diagram taken along lines 4B—4B of FIG. 4A.

FIGS. 4A–4B show views that illustrate an example of a first embodiment 400 of self-protecting NMOS transistor array 300 in accordance with the present invention. FIG. 4A shows a plan view, while FIG. 4B shows a cross-sectional diagram taken along lines 4B—4B of FIG. 4A.

As shown in FIGS. 4A and 4B, ESD region 316 in embodiment 400 of array 300 includes an n+ drain ballasting region 410 that contacts the semiconductor material SM, the portion of first channel strip CS1, the portion of second channel strip CS2, first isolation region 312, and second isolation region 314.

In addition, as further shown in FIGS. 4A–4B, ESD region 316 in embodiment 400 of array 300 includes a number of contacts 412 that contact drain ballasting region 410. Each contact 412, in turn, lies substantially midway between the first and second channel strips CS1 and CS2, and is electrically connected to the drain strips D that lie above and below as shown in FIG. 4A.

During normal operation, n+ drain ballasting region 410 functions as a resistor placed in series with the drain. Thus, when the source strips S and semiconductor material SM are grounded, the drain strips D are connected to a supply voltage, and a positive voltage is applied to the gate strips G, a current flows from n+ drain ballasting region 410 to the source strips S that adjoin the first and second channel strips CS1 and CS2. As a result, with the exception of a larger voltage drop on the drain, ESD region 316 in embodiment 400 provides normal transistor functionality.

On the other hand, during an ESD event, a positive voltage spike on the drain strips D reverse biases the junction between n+ drain ballasting region 410 and p– semiconductor material SM, and then breaks down the junction. When the junction breaks down, holes are injected into p– semiconductor material SM, which quickly accumulate and raise the potential.

The increased potential, in turn, forward biases the junction between the semiconductor material SM and the source strips S that adjoin the first and second channel strips CS1 and CS2. As a result, the n+ source strips S that adjoin channel strips CS1 and CS2 inject electrons into p– semiconductor material SM, which are collected by region 410. The resistance provided by n+ drain ballasting region 410, in turn, reduces the voltage drop across the channel regions CS1 and CS2 to the source strips S to a safe level.

Thus, a first parasitic npn transistor turns on where the n+ source strip S that adjoins channel strip CS1 functions as the emitter, p– semiconductor material SM functions as the base, and n+ drain ballasting region 410 functions as the collector. A second parasitic npn transistor also turns on where the n+ source strip S that adjoins channel strip CS2 functions as the emitter, p– semiconductor material SM functions as the base, and n+ drain ballasting region 410 functions as the collector.

Thus, during normal operation, ESD region 316 in embodiment 400 provides standard transistor functionality. In addition, during an ESD event, ESD region 316 in embodiment 400 provides local ESD protection, turning on at a triggering point and dropping a large voltage across n+ ballasting region 410.

Figure 5A:
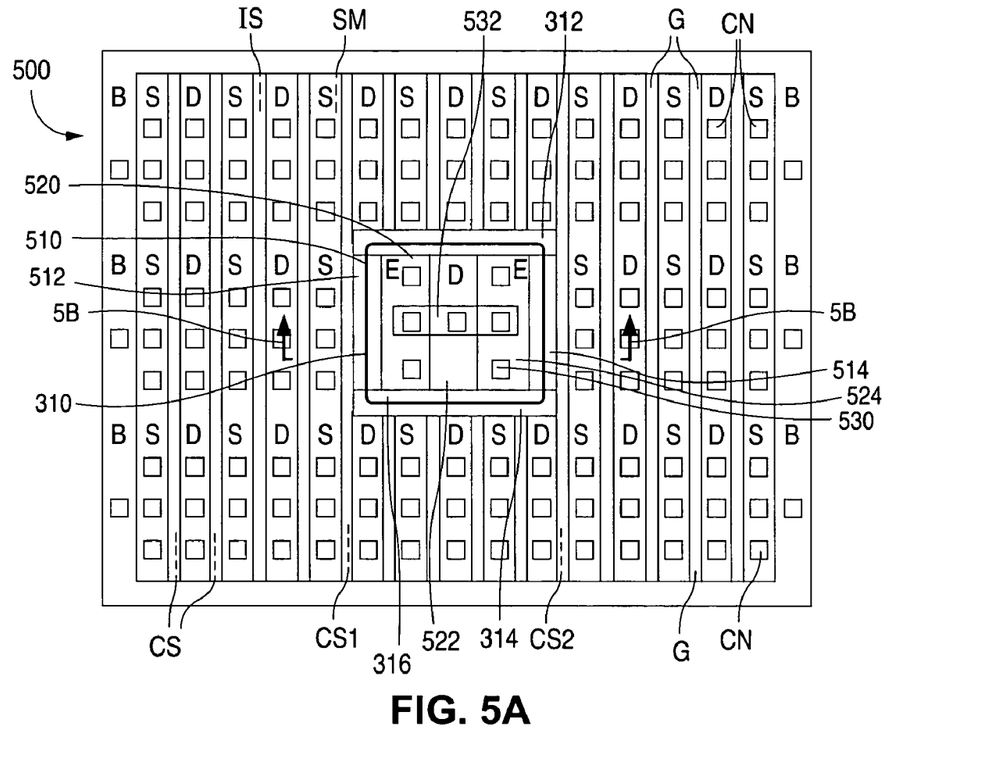
Figure 5B:
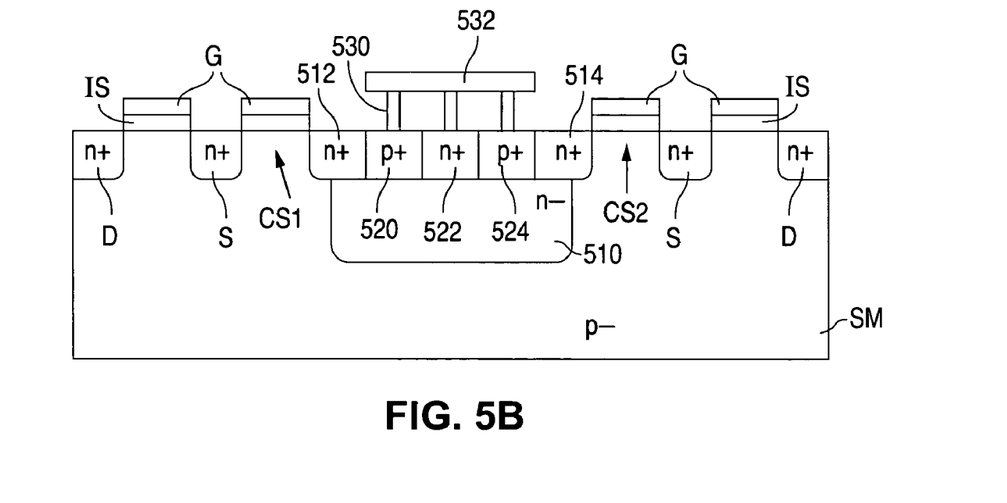
FIG. 5B is a cross-sectional diagram taken along lines 5B—5B of FIG. 5A.

FIGS. 5A–5B show views that illustrate an example of a second embodiment 500 of self-protecting NMOS transistor array 300 in accordance with the present invention. FIG. 5A shows a plan view, while FIG. 5B shows a cross-sectional diagram taken along lines 5B—5B of FIG. 5A.

As shown in FIGS. 5A–5B, ESD region 316 in embodiment 500 of array 300 includes an n– well 510, an n+ doped 512, and an n+ region 514. N-well 510 contacts the semiconductor material SM, the first isolation region 312, and the second isolation region 314. N+ region 512 contacts the semiconductor material SM, first isolation region 312, and second isolation region 314.

N+ region 512 also contacts the portion of the first channel region CS1 and n– well 510. N+ region 514, which is spaced apart from N+ region 512, also contacts the semiconductor material SM, first isolation region 312, and second isolation region 314. N+ region 514 contacts the portion of the second channel region CS2 and n– well 510.

ESD region 316 in embodiment 500 of array 300 also includes a p+ region 520, an n+ region 522, and a p+ region 524. As shown, p+ region 520 contacts n− well 510 and n+ region 512. N+ region 522 contacts n− well 510 and p+ region 520. P+ region 524, in turn, contacts n− well 510, n+ region 514, and n+ region 522.

In addition, as further shown in FIGS. 5A–5B, ESD region 316 in embodiment 500 of array 300 includes a number of contacts 530, and a conductive strip 532. The contacts 530 make an electrical connection with p+ region 520, n+ region 522, and p+ region 524. Conductive strip 532, in turn, makes an electrical connection with the contacts 530, and with the contacts CN in the drain strips D that lie vertically above and below contacts 530 as shown in FIG. 5A.

During normal operation, when the source strips S and semiconductor material SM are grounded, the drain strips D are connected to a power supply voltage, and a positive voltage is applied to the gate strips G, a current flows from n+ region 522 through n-well 510 to the n+ regions 512 and 514. From n+ region 512, the current flows through the channel to the source strip S that adjoins the first channel strip CS1. From n+ region 514, the current flows through the channel to the source strip S that adjoins the second channel strip CS2. As a result, with the exception of a larger voltage drop on the drain, ESD region 316 in embodiment 500 provides normal transistor functionality.

During an ESD event, ESD region 316 in embodiment 500 provides SCR type functionality. When a positive voltage spike occurs on the drain strips D, the voltage strike forward biases the junction between n− well 510 and p+ region 520, and between n-well 510 and p+ region 524. As a result, p+ regions 520 and 524 inject a large number of holes into n-well 510 which, in turn, quickly increases the potential on n− well 510. The rising potential eventually breaks down the junction between n-well 510 and the semiconductor material SM.

When the junction between n-well 510 and the semiconductor material SM breaks down, a hole current flows from the junction through the p− semiconductor material SM to the p+ body contact B, past the n+ source strips S. The hole flow locally increases the potential which, in turn, forward biases the junction between the p− semiconductor material SM and the n+ source strips S. As a result, the n+ source strips S inject a large number of electrons into p− substrate material SM.

The falling potential from the accumulating electrons eventually breaks down a region of the junction between p− semiconductor material SM and n− well 510. When the junction between the semiconductor material SM and n-well 510 breaks down, an electron current flows from the junction through n− well 510 to n+ region 522.

Thus, a first parasitic pnp transistor turns on where p− semiconductor material SM functions as the collector, n− well 510 functions as the base, and p+ region 520 functions as the emitter. A second parasitic pnp transistor turns on where p− semiconductor material SM functions as the collector, n− well 510 functions as the base, and p+ region 524 functions as the emitter.

In addition, a first parasitic npn transistor also turns on where n− well 510 functions as the collector, p− semiconductor material SM functions as the base, and the n+ source strip S that adjoins channel strip CS1 functions as the emitter. A second parasitic npn transistor also turns on where n− well 510 functions as the collector, p− semiconductor material SM functions as the base, and the n+ source strip S that adjoins channel strip CS2 functions as the emitter.

Thus, during normal operation, ESD region 316 in embodiment 500 provides standard transistor functionality. In addition, during an ESD event, ESD region 316 in embodiment 500 provides local ESD protection, turning on at a triggering point, and then snapping back to provide a low resistance current path when the parasitic pnp transistor and the parasitic npn transistor turn on. Further, the snap back operation is reversible and non-destructive.

Figure 6A:
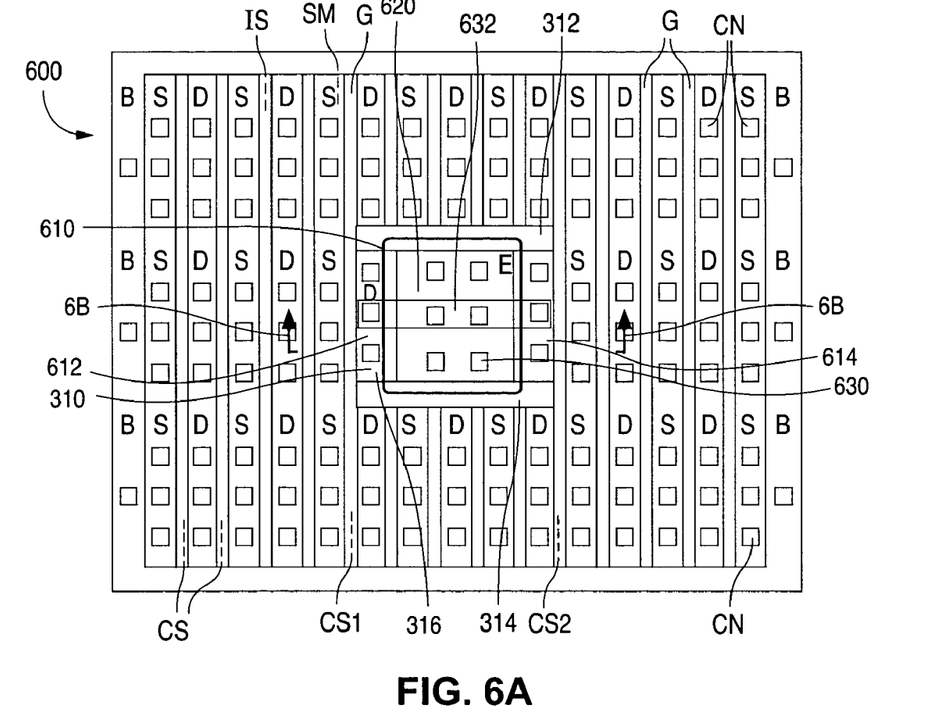
Figure 6B:
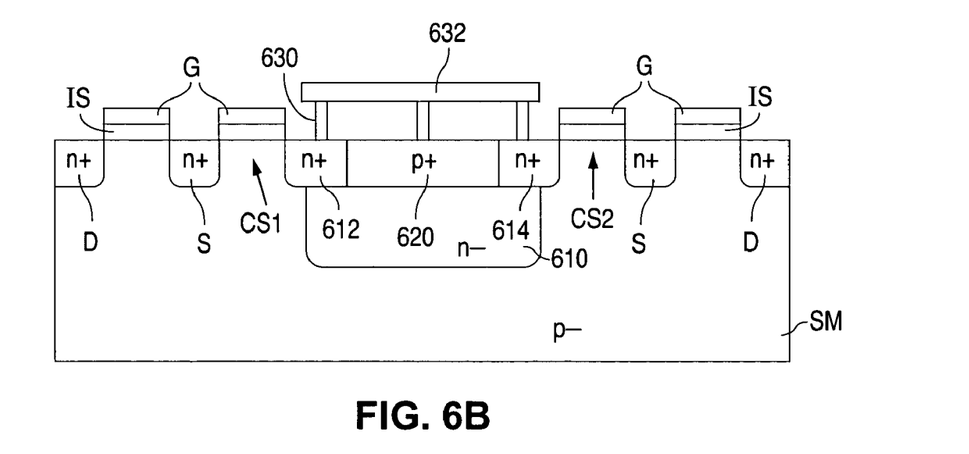
FIG. 6B is a cross-sectional diagram taken along lines 6B—6B of FIG. 6A.

FIGS. 6A–6B show views that illustrate an example of a third embodiment 600 of self-protecting NMOS transistor array 300 in accordance with the present invention. FIG. 6A shows a plan view, while FIG. 6B shows a cross-sectional diagram taken along lines 6B—6B of FIG. 6A.

As shown in FIGS. 6A–6B, ESD region 316 in embodiment 600 of array 300 includes an n− well 610, an n+ region 612, and an n+ region 614. N-well 610 contacts the semiconductor material SM, the first isolation region 312, and the second isolation region 314. N+ region 612 contacts the semiconductor material SM, first isolation region 312, and second isolation region 314.

N+ region 612 also contacts the portion of first channel region CS1 and n− well 610. N+ region 614, which is spaced apart from N+ region 612, also contacts semiconductor material SM, first isolation region 312, and second isolation region 314. N+ region 614 contacts the portion of second channel region CS2 and n− well 610.

ESD region 316 in embodiment 600 of array 300 also includes a p+ region 620 that contacts n− well 610, n+ region 612, n+ region 614, first isolation region 312, and second isolation region 314. In addition, as further shown in FIGS. 6A–6B, ESD region 316 in embodiment 600 of array 300 includes a number of contacts 630, and a conductive strip 632. The contacts 630 make an electrical connection with n+ region 612, n+ region 614, and p+ region 620. Conductive strip 632, in turn, makes an electrical connection with the contacts 630, and with the contacts CN connected to the drain strips D that lie vertically above and below as shown in FIG. 6A.

During normal operation, when the source strips S and semiconductor material SM are grounded, the drain strips D are connected to a supply voltage, and a positive voltage is applied to the gate strips G, a current flows from n+ region 612 through p− semiconductor material SM to the n+ source strip S that adjoins channel region CS1. In addition, a current also flows from n+ region 614 through p− semiconductor material SM to the n+ source strip S that adjoins channel region CS2. As a result, ESD region 316 in embodiment 600 provides normal transistor functionality that is substantially identical to the other transistor segments in the array.

During an ESD event, when a positive voltage spike occurs on the drain strips D, the voltage strike forward biases the junction between n− well 610 and p+ region 620. As a result, p+ region 620 injects a large number of holes into n-well 610 which, in turn, quickly increases the potential on n− well 610. The rising potential breaks down the junction between n-well 610 and p− semiconductor material SM.

When the junction between n-well 610 and p− semiconductor material SM breaks down, a hole current flows from the junction through the p− semiconductor material SM to the p+ body contact B, past the n+ source strips S. The hole flow locally increases the potential which, in turn, forward biases the junction between p− semiconductor material SM and the n+ source strips S. As a result, the n+ source strips S inject a large number of electrons into the p− substrate material SM.

The falling potential resulting from the accumulating electrons eventually breaks down a region of the junction between p– semiconductor material SM and n+ region 612, and a region of the junction between p– semiconductor material SM and n+ region 614. When the junction between p– semiconductor material SM and n+ region 612 breaks down, electrons flow into n+ region 612. When the junction between the semiconductor material SM and n+ region 614 breaks down, electrons flow into n+ region 614.

Thus, a parasitic pnp transistor turns on where p– semiconductor material SM functions as the collector, n– well 610 functions as the base, and p+ region 620 functions as the emitter. In addition, a parasitic npn transistor turns on where n+ region 612 functions as the collector, the p– semiconductor material SM functions as the base, and the n+ source strip S that adjoins channel strip CS1 functions as the emitter. Further, a parasitic npn transistor also turns on where n+ region 614 functions as the collector, the p– semiconductor material SM functions as the base, and the n+ source strip S that adjoins channel strip CS2 functions as the emitter.

As a result, during normal operation, ESD region 316 in embodiment 600 provides standard transistor functionality. In addition, during an ESD event, ESD region 316 in embodiment 600 provides local ESD protection, turning on at a triggering point, and then snapping back to provide a low resistance current path when the parasitic pnp transistor and the parasitic npn transistor turn on. Further, the snap back operation is reversible and non-destructive.

Thus, the present invention provides a transistor array that includes one or more ESD regions that prevent a local region of the array from experiencing a destructive ESD pulse. In addition, during normal operation, the ESD regions provide standard transistor functionality. As a result, a transistor array in accordance with the present invention can be utilized in an open drain output circuit without experiencing localized ESD destruction.

Figure 7:
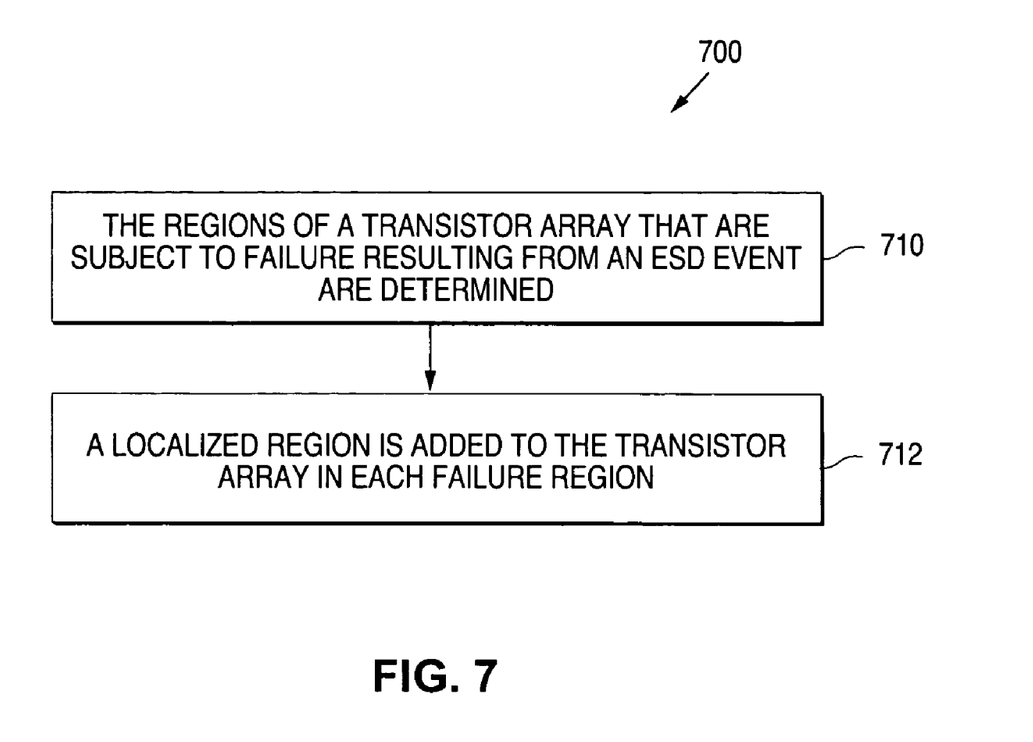
FIG. 7 is a flow chart illustrating an example of a method of forming a transistor array in accordance with the present invention.

FIG. 7 shows a flow chart that illustrates an example of a method of forming a transistor array in accordance with the present invention. As shown in FIG. 7, at step 710, the regions of a transistor array that are subject to failure resulting from an ESD event are determined. At 712, a localized region in accordance with the present invention is added to the array in each failure region. For example, localized region 310 and ESD region 316 of embodiments 400, 500, and 600 can be added to each failure region.

It should be understood that the above descriptions are examples of the present invention, and that various alternatives of the invention described herein may be employed in practicing the invention. For example, although the invention has been described in terms of an NMOS transistor array, other arrays, such as bipolar arrays, can alternately be used. Thus, it is intended that the following claims define the scope of the invention and that structures and methods within the scope of these claims and their equivalents be covered thereby.

What is claimed is:

1. A transistor array formed in a semiconductor material of a first conductivity type, the transistor array comprising:
    a plurality of spaced-apart source strips of a second conductivity type, the source strips contacting the semiconductor material;
    a plurality of spaced-apart drain strips of the second conductivity type, the drain strips contacting the semiconductor material;
    a plurality of channel strips of the semiconductor material, the channel strips lying between the source and drain strips so that each channel strip lies between and contacts a source strip and a drain strip;
    a plurality of isolation strips, the plurality of isolation strips contacting the plurality of channel strips;
    a plurality of gate strips, the gate strips contacting the plurality of isolation strips; and
    a localized region that contacts a first channel strip and a second channel strip.

2. The transistor array of claim 1 wherein the localized region includes:
    a first isolation region that contacts the semiconductor material and extends from the first channel strip to the second channel strip;
    a second isolation region spaced apart from the first isolation region, the second isolation region contacting the semiconductor material and extending from the first channel strip to the second channel strip; and
    an ESD region that contacts the semiconductor material, a portion of the first channel strip, and a portion of the second channel strip, the ESD region lying between and contacting the first and second isolation regions.

3. The transistor array of claim 2 wherein the ESD region includes a drain ballasting region of the second conductivity type, the drain ballasting region contacting the semiconductor material, the portion of the first channel strip, the portion of the second channel strip, the first isolation region, and the second isolation region.

4. The transistor array of claim 3 wherein at least one channel strip lies between the first and second channel strips.

5. The transistor array of claim 4 and further comprising a plurality of contacts that contact the drain ballasting region, each contact lying substantially midway between the first and second channel strips.

6. The transistor array of claim 2 wherein the ESD region includes:
    a well of the second conductivity type that contacts the semiconductor material, the first isolation region, and the second isolation region;
    a first doped region of the second conductivity type, the first doped region contacting the portion of the first channel region and the well, and having a dopant concentration that is greater than a dopant concentration of the well; and
    a second doped region of the second conductivity type, the second doped region contacting the portion of the second channel region and the well, the first and second doped regions being spaced apart and having substantially equal dopant concentrations.

7. The transistor array of claim 6 wherein the ESD region further includes:
    a third doped region of the first conductivity type, the third doped region contacting the first doped region and the well;
    a fourth doped region of the second conductivity type, the fourth doped region contacting the third doped region and the well; and
    a fifth doped region of the first conductivity type, the fifth doped region contacting the second doped region, the fourth doped region, and the well.

8. The transistor array of claim 7 and further comprising a conductive line electrically connected to the third, fourth, and fifth doped regions.

9. The transistor array of claim 6 wherein the ESD region further includes a third doped region of the first conductivity type, the third doped region contacting the first doped region, the second doped region, and the well.

10. The transistor array of claim 9 and further comprising a conductive line electrically connected to the first, second, and third doped regions.

11. The transistor array of claim 2 wherein the localized region can lie anywhere within the array.

12. The transistor array of claim 2 wherein when a gate voltage is applied to the plurality of gate strips, a current flows from the localized region to first and second source strips that lie adjacent to the first and second channel strips.

13. The transistor array of claim 12 wherein when an ESD pulse is applied to the drain strips, an ESD current flows from the localized region to the semiconductor material.

14. The transistor array of claim 13 wherein when the ESD pulse is applied, the localized region prevents the voltage on the drain strips from exceeding a predetermined value.

15. The transistor array of claim 2 wherein the channel strips have different lengths.

16. The transistor array of claim 2 wherein a plurality of channel strips lie between the first and second channel strips.

* * * * *